United States Patent
Tsai

(10) Patent No.: US 7,524,730 B2
(45) Date of Patent: Apr. 28, 2009

(54) METHOD OF FABRICATING BIPOLAR JUNCTION TRANSISTOR

(75) Inventor: Mingshang Tsai, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/735,505

(22) Filed: Apr. 16, 2007

(65) Prior Publication Data

US 2007/0184608 A1 Aug. 9, 2007

Related U.S. Application Data

(62) Division of application No. 11/161,619, filed on Aug. 10, 2005, now Pat. No. 7,358,545.

(51) Int. Cl.
*H01L 21/331* (2006.01)
(52) U.S. Cl. .......... 438/312; 438/235; 257/517; 257/552; 257/578; 257/E29.114
(58) Field of Classification Search .......... 257/517, 257/552, 578, E29.033; 438/235, 312
See application file for complete search history.

(56) References Cited

U.S. PATENT DOCUMENTS

| | | | | |
|---|---|---|---|---|
| 5,024,971 A | * | 6/1991 | Baker et al. | 438/586 |
| 5,072,133 A | * | 12/1991 | Zoutendyk | 327/535 |
| 5,237,200 A | * | 8/1993 | Nanba et al. | 257/653 |
| 7,084,485 B2 | * | 8/2006 | Kirchgessner | 257/577 |

* cited by examiner

*Primary Examiner*—Howard Weiss
*Assistant Examiner*—John C Ingham
(74) *Attorney, Agent, or Firm*—Jianq Chyun IP Office

(57) ABSTRACT

A method of fabricating a bipolar junction transistor is provided herein. An isolation structure is formed on a first conductive type substrate. A second conductive type deep well is formed in the first conductive type substrate to serve as a collector. Thereafter, a second conductive type well is formed in the substrate and then a first conductive type well is formed in the substrate to serve as a base. A buffer region is formed underneath a portion of the isolation structure and between the base and the second conductive well. The buffer region together with the isolation structure isolates the base from the second conductive type well. A second conductive type emitter and a second conductive type collector pick-up region are selectively formed on the surface of the first conductive type substrate. Thereafter, a first conductive type base pick-up region is selectively formed.

5 Claims, 7 Drawing Sheets

METHOD OF FABRICATING BIPOLAR JUNCTION TRANSISTOR

CROSS-REFERENCE TO RELATED APPLICATION

This application is a divisional of a prior application Ser. No. 11/161,619, filed Aug. 10, 2005, now pending. The entirety of the above-mentioned patent application is hereby incorporated by reference herein and made a part of this specification.

BACKGROUND OF THE INVENTION

1. Field of the Invention

The present invention relates to a semiconductor device and method of fabricating the same. More particularly, the present invention relates to a bipolar junction transistor structure and method of fabricating the same.

2. Description of the Related Art

In the modem integrated circuit design, bipolar junction transistors are often used in high voltage, high power or high frequency sections as well as places requiring quick switching. Bipolar junction transistors includes p-n-p junction type and n-p-n junction type. The n-type collector of a typical n-p-n bipolar junction transistor is an n-type well formed in a p-type substrate. The p-type base is a p-type well formed within the n-type well. The n-type emitter is an n-doped region within the p-type well. Since the p-type base contacts with the n-type collector directly, reverse junction leakage is a serious problem. Moreover the current gain of the bipolar junction transistor is low.

SUMMARY OF THE INVENTION

Accordingly, at least one objective of the present invention is to provide a bipolar junction transistor and method of fabricating thereof that can reduce the reverse junction leakage current of the device.

At least a second objective of the present invention is to provide a bipolar junction transistor and method of fabricating thereof that can increase the current gain of the device.

To achieve these and other advantages and in accordance with the purpose of the invention, as embodied and broadly described herein, the invention provides a bipolar junction transistor. The transistor comprises a first conductive type well, a second conductive type emitter, a second conductive type well, a second conductive type deep well, an isolation structure, a buffer region, a second conductive type collector pick-up region and a first conductive type base pickup region in a first conductive type substrate. The first conductive type well surrounds the emitter and connects with the bottom of the emitter to serve as a base. The first conductive type base pick-up region connects with the base and surrounds the emitter. The second conductive type deep well connects with the bottom of the base and the bottom of the second conductive well to serve as a collector. The second conductive type well surrounds the base and connects with the second conductive type deep well. The second conductive type collector pick-up region connects with the second conductive type well and surrounds the base. The isolation structure is disposed between the emitter and the base and between a portion of the base and a portion of the second conductive type well. The buffer region is disposed under the isolation structure. Furthermore, the buffer region together with a portion of the isolation structure isolates the first conductive type base and the second conductive type well.

In one embodiment, the buffer region is a first conductive type doped region with a dopant concentration lower than the dopant concentration of the base, a second conductive type doped region with a dopant concentration lower than the second conductive type well, or an insulating layer.

In one embodiment, the bipolar junction transistor further comprises a silicide layer disposed on the emitter, the second conductive type collector pick-up region and the first conductive type base pick-up region.

The present invention also provides an alternative bipolar junction transistor. The transistor comprises a first conductive type well, a second conductive type emitter, a second conductive type well, a second conductive type deep well, an isolation structure, a buffer region, a second conductive type collector pick-up region and a first conductive type base pick-up region in a first conductive type substrate. The second conductive type well is disposed on the two sides of the emitter. The second conductive type collector pick-up region is disposed on the two sides of the emitter and connects with the second conductive type well. The first conductive type well is disposed between the emitter and the second conductive type well and connects wit the bottom of the emitter to serve as a base. The second conductive type collector pick-up region is disposed on the two sides of the emitter and connects with the collector. The second conductive type deep well connects with the bottom of the base and the bottom of the second conductive type well to serve as a collector. The isolation structure is disposed between the emitter and the base and between a portion of the base and a portion of the second conductive type well. The buffer region is disposed under the isolation structure. Furthermore, the buffer region together with a portion of the isolation structure isolates the base from the second conductive type well.

In one embodiment, the buffer region is a first conductive type doped region with a dopant concentration lower than the dopant concentration of the base, or a second conductive type doped region with a dopant concentration lower than the second conductive type well, or an insulating layer.

In one embodiment, the bipolar junction transistor further comprises a silicide layer disposed on the emitter, the second conductive type collector pick-up region and the first conductive type base pick-up region.

The present invention also provides a method of fabricating a bipolar junction transistor. An isolation structure is formed on a first conductive type substrate. Then, a second conductive type deep well is formed in the first conductive type substrate to serve as a collector. Thereafter, a second conductive type well is formed in the substrate and then a first conductive type well is formed in the substrate to serve as a base. After that, a buffer region is formed underneath a portion of the isolation structure and between the base and the second conductive well. The buffer region together with the isolation structure isolates the base from the second conductive type well. Then, a second conductive type emitter and a second conductive type collector pick-up region are selectively formed on the surface of the first conductive type substrate. Thereafter, a first conductive type base pick-up region is selectively formed.

In one embodiment, the buffer region is a first conductive type doped region with a dopant concentration lower than the dopant concentration of the base. In addition, the method of fabricating the base, the second conductive type well and the buffer region includes forming a first photoresist mask over the first conductive type substrate and performing a vertical ion implant process using second conductive type dopants to form the second conductive type well. Then, the first photoresist mask is removed. Thereafter, a second photoresist mask is formed over the first conductive type substrate and then another vertical ion implant process is performed using first conductive type dopants to form the base. There is a gap between the second conductive type well and the base. The gap is a portion of the first conductive type substrate and serves as the buffer region. Finally, the second photoresist mask is removed. Alternatively, the base is formed prior to forming the second conductive type well and the buffer layer.

In another embodiment, the buffer region is a second conductive type doped region with a dopant concentration lower than the dopant concentration of the second conductive type well. In addition, the method of fabricating the base, the second conductive type well and the buffer region includes forming a first photoresist mask over the first conductive type substrate and performing a tilted ion implant process using second conductive type dopants to form the second conductive well. Simultaneously, a second conductive type doped region is formed between the second conductive type well and the base to serve as the buffer region. Then, the first photoresist mask is removed. Thereafter, a second photoresist mask is formed over the first conductive type substrate and then a vertical ion implant process is performed using first conductive type dopants to form the base. After that, the second photoresist mask is removed. Alternatively, the base is formed prior to forming the second conductive type well and the buffer layer.

In another embodiment, the buffer region is an insulating layer. The insulating layer is formed together with the fabrication of the isolation structure.

In one embodiment, the method of fabricating the bipolar junction transistor further includes forming a silicide layer over the emitter, the second conductive type collector pick-up region and the first conductive type base pick-up region.

In the present invention, the second conductive type well and the first conductive type well are isolated from each other through the isolation structure and the buffer region. Hence, the reverse junction leakage current of the transistor is stopped or attenuated and the current gain of the transistor is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
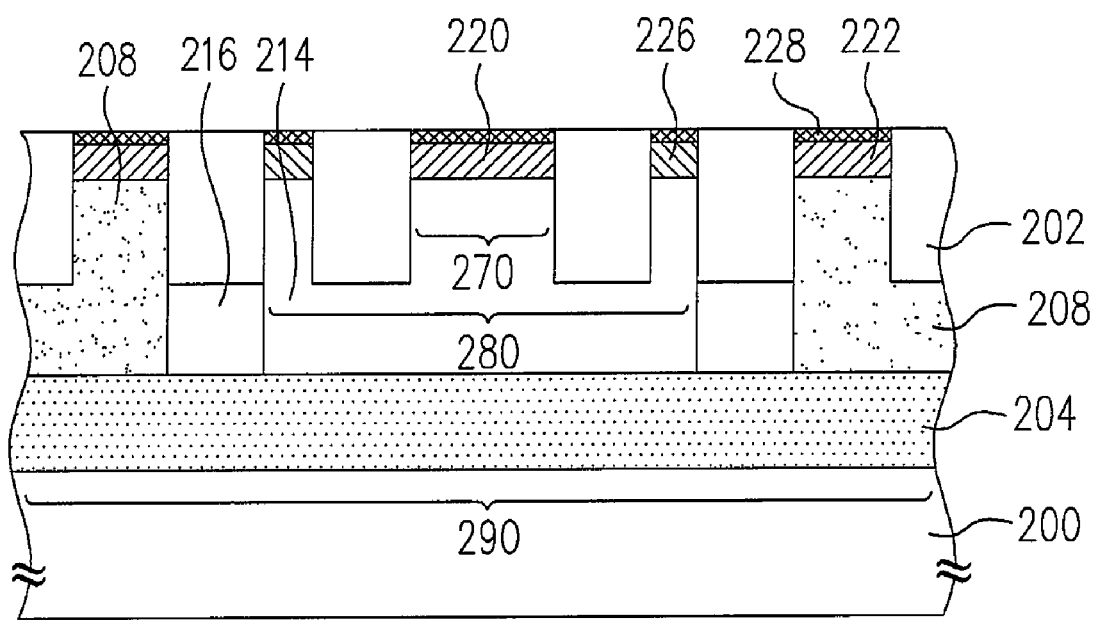
FIG. 1 is a schematic cross-sectional view of a bipolar junction transistor according to the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
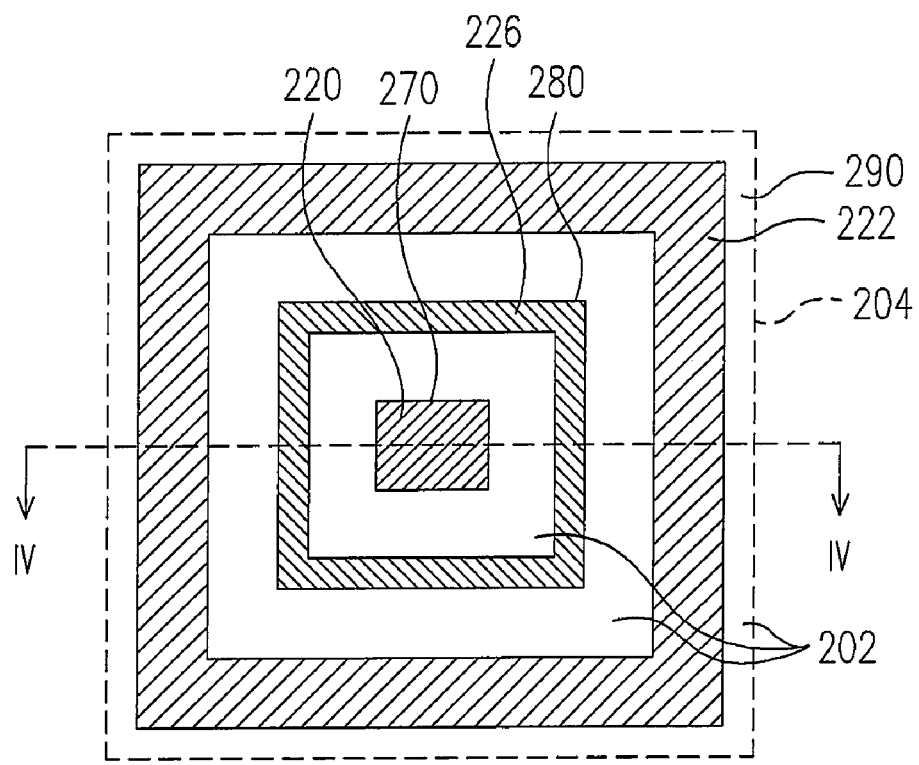
FIG. 2 is a top view of the bipolar junction transistor in FIG. 1 without showing a silicide layer.
Figure 3:
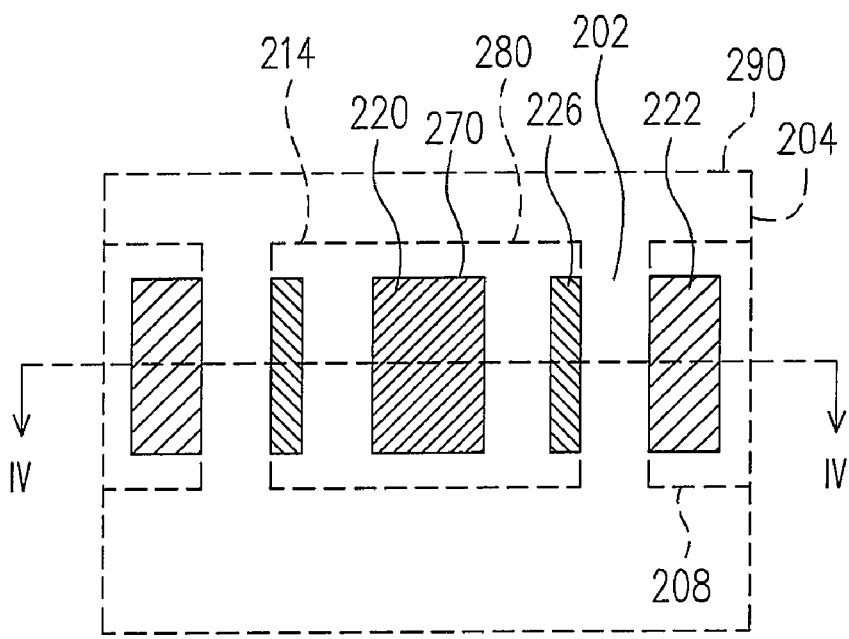
FIG. 3 is a top view of another bipolar junction transistor in FIG. 1 without showing a silicide layer.

FIG. 1 is a schematic cross-sectional view of a bipolar junction transistor according to the present invention. FIG. 2 is a top view of the bipolar junction transistor in FIG. 1 without showing a silicide layer. FIG. 3 is a top view of another bipolar junction transistor in FIG. 1 without showing a silicide layer. In the following, an n-p-n bipolar junction transistor is used to simplify explanations. This should by no means limit the present invention as such. The method in the present invention applies equally to a p-n-p bipolar junction transistor.

As shown in FIGS. 1 and 2, the bipolar junction transistor of the present invention comprises a buffer region 216 that isolates a p-type base 214 from an n-type well 208. More specifically, the bipolar junction transistor in one embodiment of the present invention is formed in a p-type substrate 200. The bipolar junction transistor comprises an emitter region 270, a base region 280 and a collector region 290. The emitter region 270 has an n-doped region 220 to serve as an emitter. The base region 280 has a p-type well 214 that serves as a base and a p-type base pick-up region 226. The p-type well region 214 surrounds the emitter region 220 and is isolated from the emitter region 220 through an isolation structure 202. Furthermore, the side of the p-type well 214 connects with the bottom of the emitter region 220. The p-type base pick-up region 226 is located on the p-type well 214 and surrounds the emitter region 220. The collector region 290 comprises an n-type deep well 204 serving as a collector, an n-type well 208 and an n-type collector pick-up region 222. The n-type deep well 204 connects with the bottom of the p-type well 214 and the bottom of the n-type well 208. The n-type well 208 surrounds the p-type well 214 and the n-type well 208 is isolated from the p-type well 214 through the isolation structure 202 and a buffer region 216. The n-type collector pick-up region 222 is disposed on and electrically connected to the n-type well 208. The buffer region 216 in the present invention can be a p-doped region with a dopant concentration lower than the dopant concentration of the base region 280, for example, a p-doped region having a dopant concentration identical to the dopant concentration of the substrate 200. Alternatively, the buffer region 216 can be an n-doped region with a dopant concentration lower than the dopant concentration of the n-type well region 208, for example, an n-doped region with a concentration gradient. Alternatively, the buffer region 216 can be an insulating layer fabricated, for example, using an insulating material identical to the isolation structure 202. To reduce the resistance of the n-type emitter region 220, the n-type collector pick-up region 222 and the p-type base pick-up region 226, a silicide layer 228 (not shown in FIG. 2) can also form over theses areas.

In the present invention, the n-type well 208 and the p-type well 214 are isolated from each other through the isolation structure 202 and the buffer region 216 having a dopant concentration lower than the n-type well 208 and the p-type well 214 or fabricated from an insulating material. Therefore, the reverse leakage current of the transistor is stopped or attenuated and the current gain of the transistor is increased.

As shown in FIGS. 1 and 3, according to another embodiment, the p-type base pick-up region 226 is similarly connected to the base region 280. However, the p-type base pick-up region 226 is disposed on the two sides of the emitter 220 instead of surrounding the emitter 220. The n-type well 208 is similarly connected to the n-type deep well 204. The n-type well 208 is disposed on the two sides of the p-type well 214 without surrounding the p-type well 214. The n-type collector pick-up region 222 is connected to the n-type well 208. Similarly, the n-type collector pick-up region 222 is disposed on the two sides of the p-type well 214 without surrounding the p-type well 214.

Figure 4A:
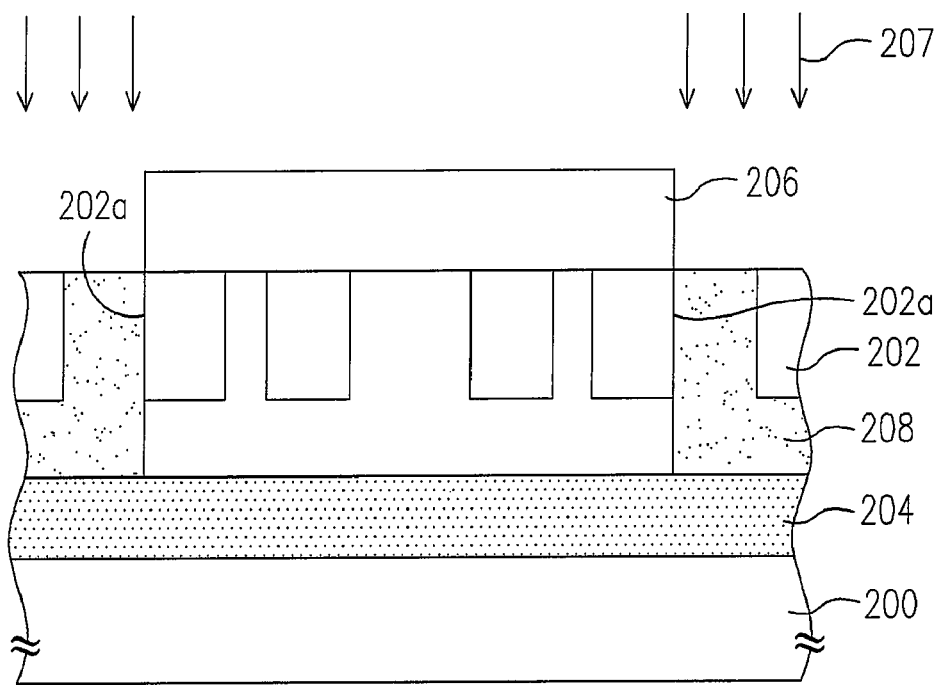
FIGS. 4A through 4E are schematic cross-sectional views showing the process for fabricating a bipolar junction transistor according to one embodiment of the present invention.

FIGS. 4A through 4E are schematic cross-sectional views showing the process for fabricating a bipolar junction transistor according to one embodiment of the present invention. As shown in FIG. 4A, an isolation structure 202 is formed in a p-type substrate 200. The isolation structure 202 is a shallow trench isolation (STI) structure formed by a STI process, for example. Thereafter, an ion implant process is carried out to form an n-type deep well 204 in the substrate 200 to serve as a collector region.

Thereafter, an n-type well 208 is formed in the substrate 200. The method of fabricating the n-type well 208 includes forming a photoresist mask 206 over the substrate 200. In one embodiment, the photoresist mask 206 exposes the substrate 200 outside the boundary 202a of the isolation structure 202. Then, a vertical ion implant process 207 is performed to form the n-type well 208 in the substrate 200. Lastly, the photoresist mask 206 is removed.

Figure 4B:
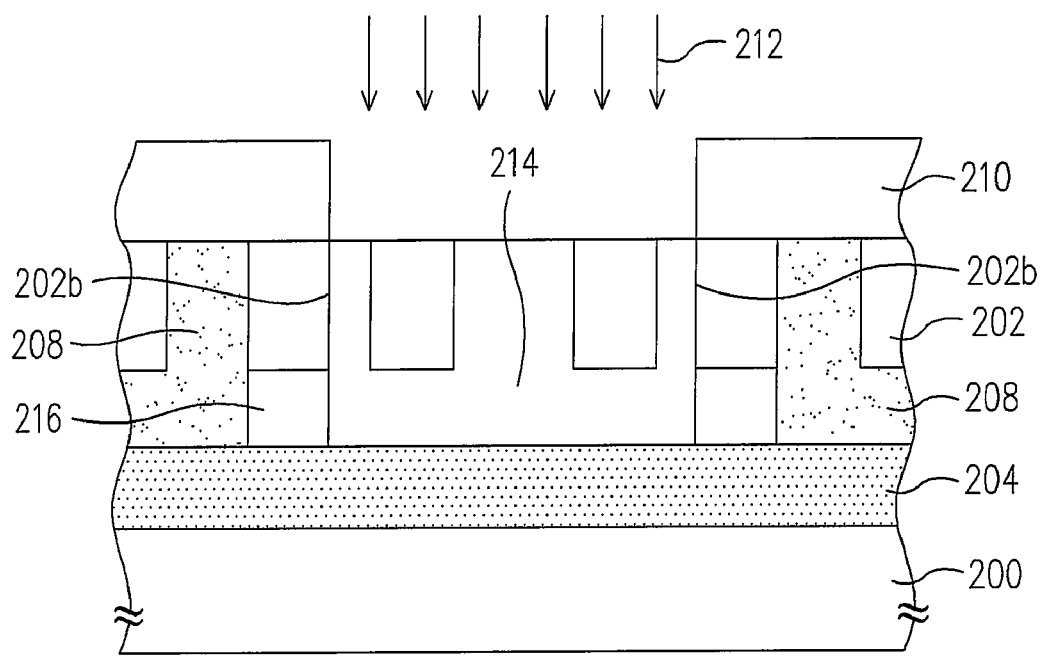

As shown in FIG. 4B, another photoresist mask 210 is formed over the substrate 200. In one embodiment, the photoresist mask 210 exposes the surface of the substrate 200 within the boundary 202b of the isolation structure 202. Thereafter, a vertical ion implant process 212 is performed to form the p-type well 214 in the substrate 200. The p-type well 214 serves as a base region. After that, the photoresist mask 210 is removed.

After the aforementioned steps, there is an area between the p-type well 214 and the n-type well 208 not affected by the ion implant processes 207 and 212. This area is the buffer region 216. The buffer region 216 together with the isolation structure 202 isolates the p-type well 214 from the n-type well 208. The buffer region 216 has a dopant type and dopant concentration identical to the p-type substrate 200. In other words, the dopant type of the buffer region 216 is identical to the p-type well 214 but the dopant concentration of the buffer region 216 is lower than the p-type well 214.

Figure 5:
FIG. 5 is a schematic cross-sectional view showing one of the steps in the process of fabricating a bipolar junction transistor according to another embodiment of the present invention.
Figure 5:
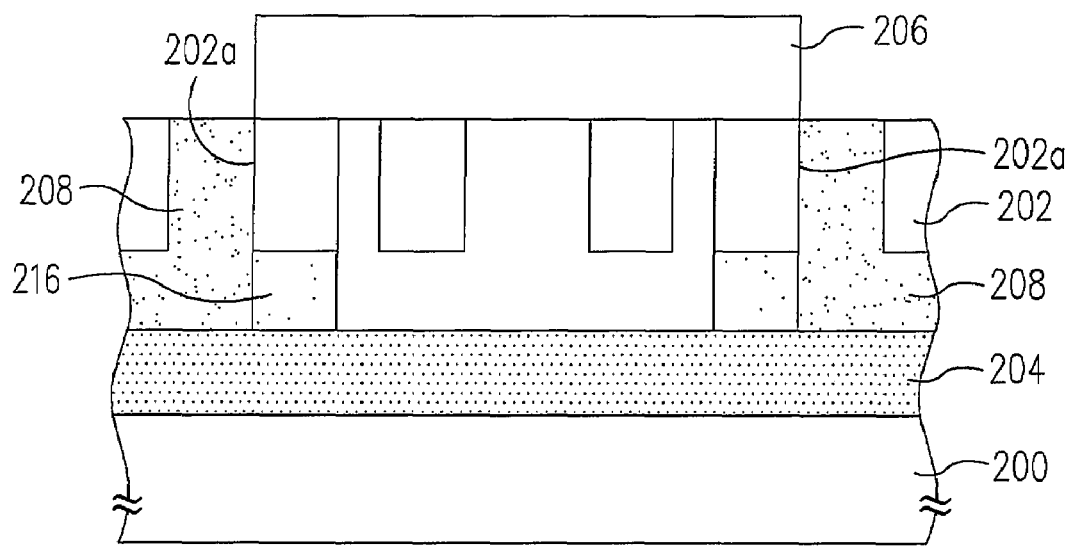
Figure 5:

FIG. 5 is a schematic cross-sectional view showing one of the steps in the process of fabricating a bipolar junction transistor according to another embodiment of the present invention. The buffer region 216 can be an n-doped region having a dopant type identical to the n-type well 208 but a lower dopant concentration. The method of forming the buffer region 216 includes forming photoresist material to form a photoresist mask 206 over the substrate 200 and then performing a tilted ion implant process 307 so that an n-type well 208 is formed in the exposed substrate 200. In the meantime, the area underneath the isolation structure 202 and adjacent to the photoresist mask 206 will form an n-doped region with a concentration gradient due to a blockage by the isolation structure 202. Hence, this area becomes a buffer region 216. Thereafter, the photoresist mask 206 is removed and then the p-type well 214 is formed according to the step in FIG. 1B.

Figure 4C:
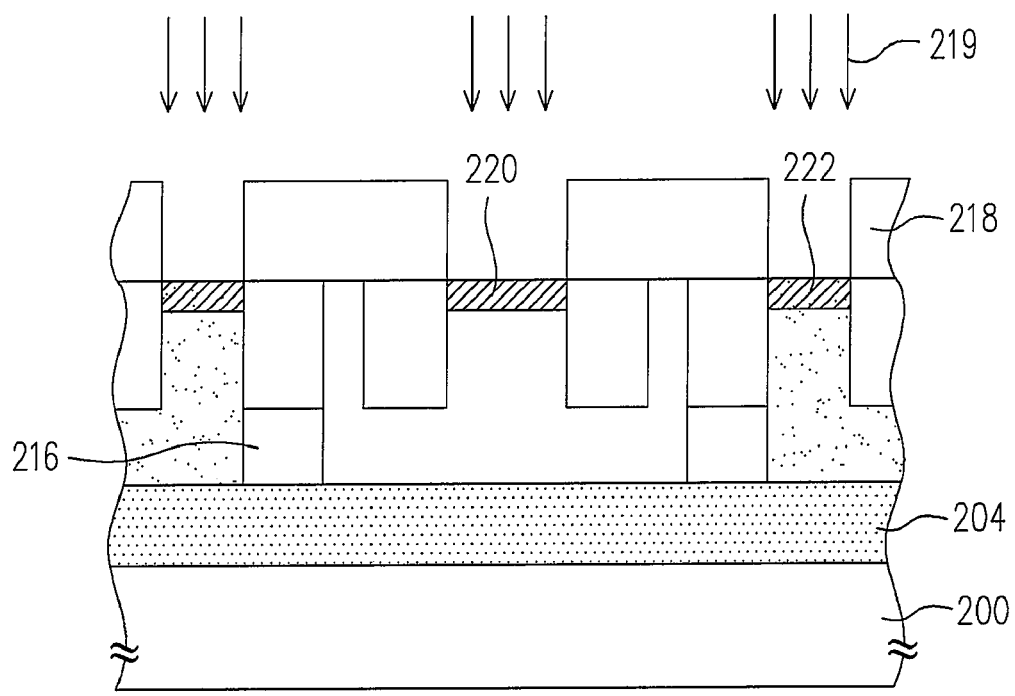

As shown in FIG. 4C, an n-type emitter region 220 and an n-type collector pick-up region 222 are selectively formed on the surface of the substrate 200. The method of forming the n-type emitter region 220 and the n-type collector pick-up region 222 includes fabricating a patterned photoresist mask 218 over the substrate 200, performing an ion implant process 219 and removing the photoresist layer 218 thereafter.

Figure 4D:
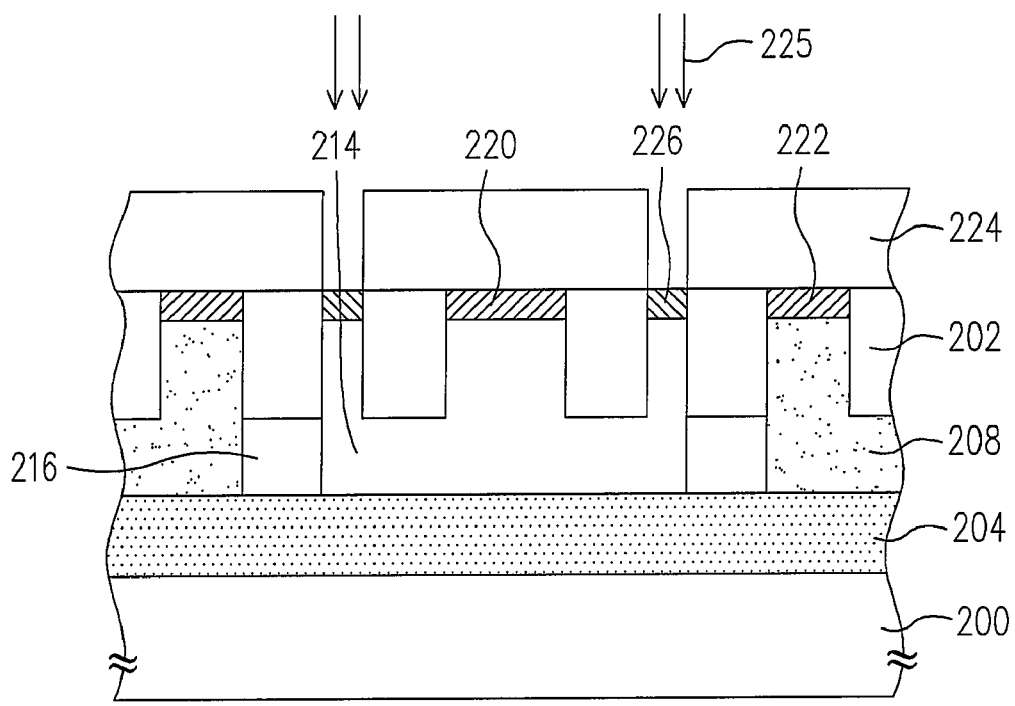

As shown in FIG. 4D, a p-type base pick-up region 226 is selectively formed on the surface of the substrate 200. The method of forming the p-type base pick-up region 226 includes fabricating a patterned photoresist mask 224 over the substrate 200, performing an ion implant process 225 and removing the photoresist mask 224.

Figure 4E:
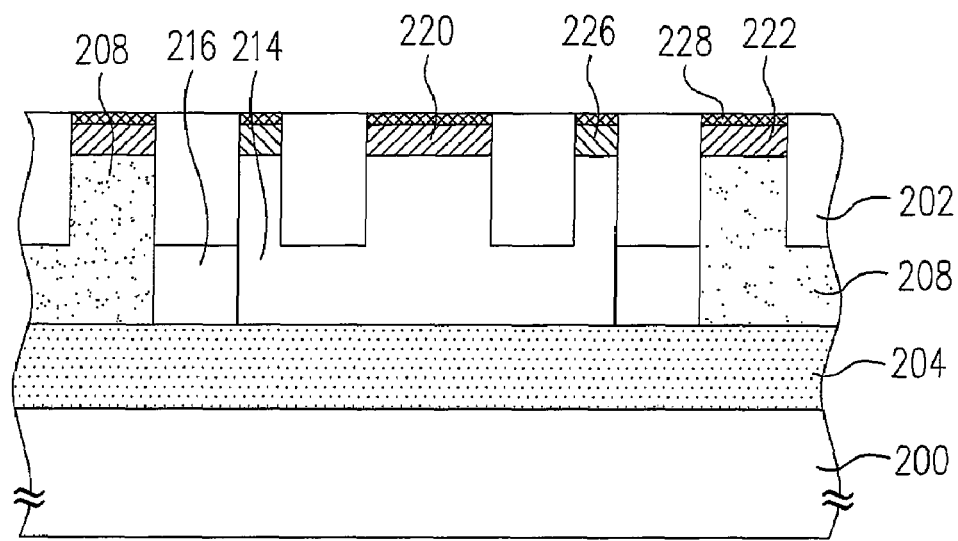

As shown in FIG. 4E, a silicide layer 228 is formed over the n-type emitter region 220, the n-type collector pick-up region 222 and the p-type base pick-up region 226.

Figure 6A:
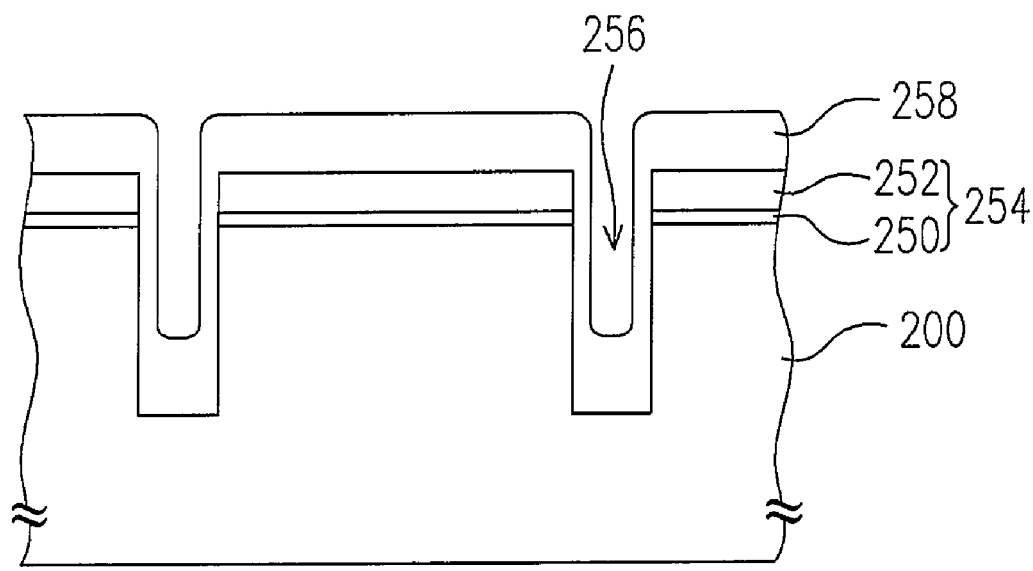
FIGS. 6A through 6C are schematic cross-sectional views showing some of the steps in the process of fabricating a bipolar junction transistor according to another embodiment of the present invention.
Figure 6B:
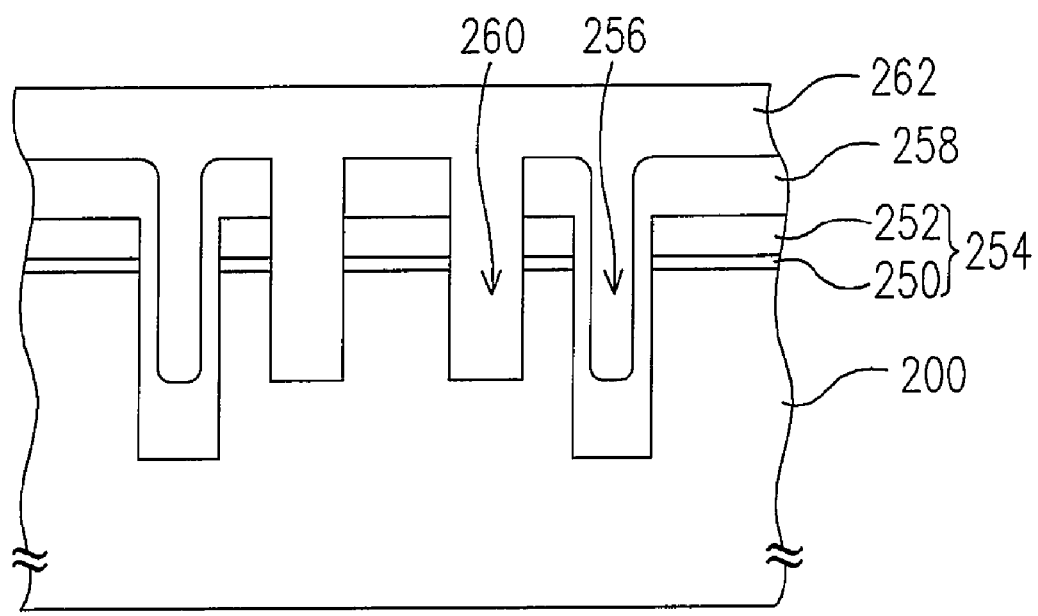
Figure 6C:
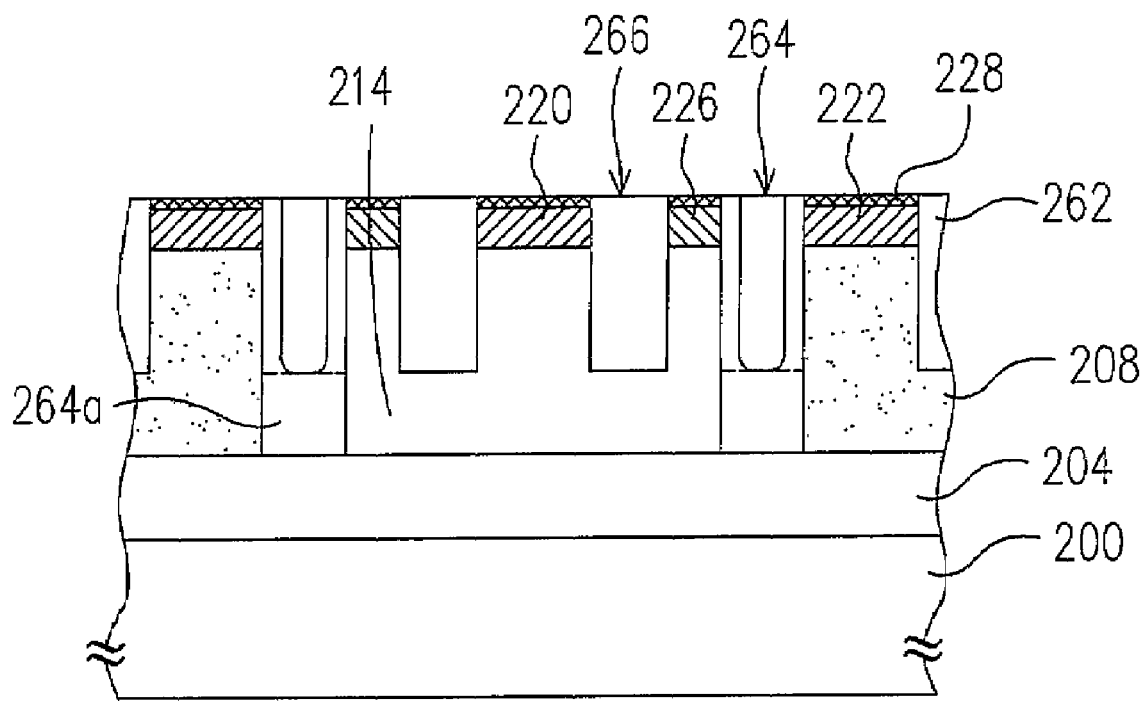

FIGS. 6A through 6C are schematic cross-sectional views showing some of the steps in the process of fabricating a bipolar junction transistor according to another embodiment of the present invention. In another embodiment of the present invention, the buffer region 216 can be an insulating layer. The insulating layer is formed, for example, in the same process for fabricating the isolation structure 202. For example, as shown in FIG. 6A, a patterned hard mask layer 254 is formed over the substrate 200. The hard mask layer 254 comprises a pad oxide layer 250 and a silicon nitride layer 252, for example. Thereafter, using the hard mask layer 254 as an etching mask, the substrate 200 is etched to form a deeper trench 256. After that, an insulating material is deposited into the trench 256 to form the insulating layer 258.

As shown in FIG. 6B, the insulating layer 258 and the hard mask layer 254 is patterned and then a shallow trench 260 is formed in the substrate 200. Thereafter, insulating material is deposited over the substrate 200 to form another insulating layer 262 that completely fills the shallow trench 260 and the deep trench 256.

As shown in FIG. 6C, using the hard mask layer 254 as a stopping layer, a chemical-mechanical polishing process or a back etching process is carried out to remove excess insulating material layers 258 and 262 over the surface of the substrate 200. After that, the hard mask layer 254 is removed, thereby completing the fabrication of the deep trench isolation structure 264 and the shallow trench isolation structure 266. In the present example, the lower section of the deep trench isolation structure 264 is a buffer region 264a for isolating the subsequently formed p-type well 214 from the n-type well 208.

Thereafter, the aforementioned method is used to form the n-type deep well 204, the n-type well 208, the p-type well 214, the n-type emitter 220, the n-type collector pick-up region 222 and the p-type base pick-up region 226. Then, a silicide layer 228 is formed over the n-type emitter 220, the n-type collector pick-up region 222 and the p-type base pick-up region 226.

The aforementioned embodiments are explained using an n-p-n bipolar junction transistor. In practice, the present invention is equally applicable to a p-n-p bipolar junction transistor. In other words, a transistor having a p-type deep well 204, a p-type well 208, an n-type well 214, a p-type emitter 220, a p-type collector pick-up region 222 and an n-type base pick-up region 226.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a bipolar junction transistor, comprising the steps of:
   forming an isolation structure in a first conductive type substrate;
   forming a second conductive type deep well in the first conductive type substrate to serve as a collector;
   forming a second conductive type well in the first conductive type substrate;
   forming a first conductive type well in the first conductive type substrate to serve as a base;
   forming a buffer region under a portion of the isolation structure and between the base and the second conductive type well, wherein the buffer region and the isolation structure together isolates the base from the second conductive type well, and the buffer region is a first conductive type doped region having a dopant concentration lower than the dopant concentration of the base;
   forming a second conductive type emitter and a second conductive type collector pick-up region selectively on the surface of the first conductive type substrate; and
   forming a first conductive type base pick-up region selectively on the surface of the first conductive type substrate.

2. The method of fabricating a bipolar junction transistor of claim 1, wherein the process for forming the base, the second conductive type well and the buffer region comprising:
   forming a first photoresist mask over the first conductive type substrate and performing a second conductive type vertical ion implant process to form the second conductive type well;
   removing the first photoresist mask;
   forming a second photoresist mask over the first conductive type substrate and performing a first conductive type vertical ion implant process to form the base, wherein a gap is formed between the second conductive type well and the base, and the gap is a portion of the first conductive type substrate and serves as the buffer region; and
   removing the second photoresist mask.

3. The method of fabricating a bipolar junction transistor of claim 1, further comprises forming a silicide layer on the emitter, the second conductive type collector pick-up region and the first conductive type base pick-up region.

4. A method of fabricating a bipolar junction transistor, comprising the steps of:
   forming an isolation structure in a first conductive type substrate;
   forming a second conductive type deep well in the first conductive type substrate to serve as a collector;
   forming a second conductive type well in the first conductive type substrate;
   forming a first conductive type well in the first conductive type substrate to serve as a base;
   forming a buffer region under a portion of the isolation structure and between the base and the second conductive type well, wherein the buffer region and the isolation structure together isolates the base from the second conductive type well, and the buffer region is a second conductive type doped region having a dopant concentration lower than the dopant concentration of the second conductive type well;
   forming a second conductive type emitter and a second conductive type collector pick-up region selectively on the surface of the first conductive type substrate; and
   forming a first conductive type base pick-up region selectively on the surface of the first conductive type substrate;
   wherein the process of forming the base, the second conductive type well and the buffer region comprising:
   forming a first photoresist mask over the first conductive type substrate and performing a second conductive type tilted ion implant process to form the second conductive type well and, at the same time, the second conductive type doped region between the second conductive type well and the base to serve as the buffer region;
   removing the first photoresist mask;
   forming a second photoresist mask over the first conductive type substrate and performing a first conductive type vertical ion implant process to form the base; and
   removing the second photoresist mask.

5. The method of fabricating a bipolar junction transistor of claim 4, further comprises forming a suicide layer on the emitter, the second conductive type collector pick-up region and the first conductive type base pick-up region.

* * * * *